United States Patent Office 3,462,268

Patented Aug. 19, 1969

3,462,268

LIGHT-SENSITIVE LAYERS FOR PHOTO-CHEMICAL PURPOSES

Justus Danhauser and Willibald Pelz, Leverkusen, Germany, assignors to Gevaert-Agfa N.V., Mortsel, Belgium, a company of Belgium No Drawing. Filed June 14, 1965, Ser. No. 463,938
Claims priority, application Germany, Mar. 3, 1965, A 48,539
Int. Cl. G03f *7/08;* G03c *5/00*
U.S. Cl. 96—35.1 13 Claims

ABSTRACT OF THE DISCLOSURE

Light-sensitive layers for photochemical purposes, e.g., for acid-resistant etching resists useful in making printed circuits, stencil masters, and the like, are disclosed. These light-sensitive layers contain a polymer capable of photochemical cross-linking. The polymer contains aromatic azidosulphonyl groups linked to the polymer chain by means of a urethane radical. Especially suitable polymers are the hydroxyl-containing polyesters, polyethers, polyurethanes, and polyamides wherein at least some of the hydroxyl groups have been replaced by the urethane radicals which link the aromatic azidosulphonyl groups to the polymer chain. Optionally, the light-sensitive photographic material can also contain a sensitizer such as Michler's ketone, dimethylaminobenzaldehyde, 4-H-quinolizine-4-one, a naphthothiazoline, a cyanine, and a triphenyl methane dye.

The present invention relates to light-sensitive layers for photomechanical purposes, e.g., for acid-resistant etching resists, especially for printed circuits or for stencil masters and coated plates for printing purposes containing as light-sensitive layer a film-forming polymer that can be photochemically cross-linked.

Many polymerizates are known which are used as light-sensitive systems and which, when applied as a thin layer to a suitable support, are image-wise changed by exposure in such a way that the unchanged areas of the layer can be dissolved and removed by subsequent development with a solvent whereas the changed areas of the layer remain insoluble.

Such light-sensitive layers have been described many times; to these belong the layers prepared from a series of different polymers which contain e.g. cinnamic acid groups or chalcone groups.

It is also known to use polymers containing azide groups wherein the azide groups on exposure to light, while liberating nitrogen, give rise to cross-linking and, consequently, insolubilisation of the polymer.

In most cases the mentoned light-sensitive polymers possess, however, certain disadvantages. In cross-linked form the polymers containing cinnamic acid groups do not show a sufficient resistance against strong acids, so that they cannot be used in the image-wise etching of noble metals. Other polymers show a high acid-resistance but they are not sufficiently heat-resistant so that on storing they become useless since a slow cross-linking by heat arises. Still other polymers are very acid- and heat-resistant, but the dissolution and removal of the unexposed image areas must be carried out with solvents wherein the cross-linked portions swell strongly so that under these circumstances no sharp prints are obtained. Moreover, the production of such polymers is quite cumbrous and the removal of side-products is rather difficult.

It is an object of the present invention to provide a photographic material that contains a layer of film-forming polymers that can be photochemically cross-linked which polymer shows as improved light-sensitivity and a better chemical resistance, especially against acids.

It has now been found that light-sensitive layers can be obtained, which possess a high light-sensitivity, a high acid-resistance and heat resistance and at the same time show little swelling in the solvent used as developer, characterised in that for the formation of said layers polymers are used that contain aromatic azidosulphonyl groups linked to the polymer chain by means of an urethane radical. Polymeric compound containing structural units corresponding to the following general formula are favoured:

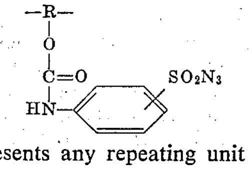

wherein R represents any repeating unit in the polymer chain.

The phenyl ring may be substituted by any group whatever such as a halogen atom e.g. chlorine or bromine, an alkyl group preferably containing at most 5 carbon atoms, an alkoxy group preferably containing at most 5 carbon atoms or a nitro group. The choice of such substituents in general depends only on the properties that are conferred by these groups to the light-sensitive polymers. Consequently, properties as e.g. solubility and so on can be influenced in the desired way.

These light sensitive polymers can be prepared by conversion in appropriate solvents of aromatic isocyanates bearing azidosulphonyl groups with polymers substituted by groups with active hydrogen atoms. According to another process, aromatic isocyanates bearing chlorosulphonyl groups can be converted with polymers substituted by groups with active hydrogen atoms. In this way chlorosulphonyl groups containing polymers are obtained which subsequently can easily be converted with sodiumazide into the corresponding sulphonylazide.

Appropriate isocyanates are e.g. the following compounds:

m-isocyanato-benzene sulphonylazide
p-isocyanato-benzene sulphonylazide
m-isocyanato-benzene sulphonylchloride
p-isocyanato-benzene sulphonylchloride
2-chloro-5-azidosulphonyl-phenyl isocyanate It is not necessary for the process according to the present invention that the azidosulphonyl groups containing phenyl compounds contain free isocyanate groups. It is also possible to use substances with so-called latent isocyanate groups. (Angewandte Chemie A 59, 265 (1947).)

The manufacture of the polymers to be used according to the invention has been described in the application Ser. No. 463,918 filed on even date herewith entitled "Method for the preparation of products that can be photochemically cross-linked."

For the preparation from the forementioned reaction partners of compounds that are soluble in organic solvents and that photochemically cross-link and thus become insoluble, it is required that said reaction partners are chosen in such a way and converted in such reaction conditions that a premature cross-linking, especially a premature insolubilisation is avoided.

Natural substances as well as synthetic high molecular weight compounds are appropriate as high molecular weight reaction components. Suitable natural polymers are e.g. cellulose, starch and gelatin or modified derivatives of these natural substances such as e.g. partly esterified or etherified cellulose.

Suitable synthetic polymers are for instance polyvinyl alcohol or copolymers containing vinyl alcohol units. Any other units of polymerisable monomers, especially vinyl monomers, may be present as non-reactive polymer components in the polymer chain, for instance units of ethylene, propylene, butylene, butadiene, isoprene, vinyl chloride, vinylidene chloride, vinyl ester, particularly vinyl acetate and vinyl propionate, vinyl ether, for instance vinyl propyl ether, vinyl isobutyl ether, acrylic or methacrylic acid, or derivatives thereof such as esters particularly those obtained with aliphatic alcohols containing at most 5 carbon atoms, nitriles, maleic anhydride, styrene and so on. Particularly suitable are the partly saponified copolymerisates of ethylene and vinyl acetate.

Polycondensates with active hydrogen atoms are also suitable, particularly those with alcoholic hydroxyl groups for instance polyesters of multivalent aliphatic or aromatic carboxylic acids with multivalent alcohols, hydroxyl groups containing polyurethanes or polyethers or hydroxyl groups containing epoxide resins as for instance obtained by conversion of multivalent carboxylic acids, alcohols or amines with epihalogen hydrins, particularly epichlorohydrin, further polyamides, for instance reaction products of multivalent carboxylic acids with multivalent amines.

The polymeric reaction partners should advantageously possess an average molecular weight of more than 1000. The average molecular weight that is best suited for the use intended can be determined in a simple way by the usual tests. The optimum molecular weight range evidently also depends on the nature of the polymers. In the case of polycondensates, products with relatively low molecular weight from about 1000–10,000 will in general be suitable. In the case of polymers in the narrow sense, particularly the polymerised vinyl compounds, products with molecular weights from above 10,000 to about 500,000 will do for most purposes. Polymers with molecular weights comprised between 15,000 and 250,000 are favoured.

It has been found that suitable polymers are those comprising from about 10 to 98 mole percent of structural units bearing active hydrogen atoms.

The polymeric components may be converted with the isocyanate groups containing phenylsulphonylazide or sulphonyl chloride compounds in any ratio whatever. There should only be taken care that the azidosulphonyl groups are present in a sufficient amount for the desired cross-linking degree. For this purpose, particularly in the case of hydroxyl groups containing polymers, it may be assumed that the isocyanate compounds react quantitatively.

For most purposes, products containing in the polymer chain 1 azidosulphonyl grouping per about 1 to 20 of other monomer units are usable. A ratio of 1 azidosulphonyl grouping to 3 to 10 other units is favoured. Particularly favourable results are attained with polymers containing 1 azidosulphonyl group for 5–6 other monomer units.

Both reaction partners are suitably applied in approximately equivalent amounts. However, in the case a high molecular weight compound with a great number of groups containing active hydrogen atoms is used, it is not necessary to use an equivalent amount of isocyanate groups containing phenyl sulphonylchloride or sulphonylazide compound. The remaining and occasionally disturbing groups with active hydrogen atoms, particularly hydroxyl groups, are suitably acylated in the known way with acylating agents or converted with isocyanates for instance with anthracene-2-isocyanate or cyclohexylisocyanate.

The reaction between the reaction partners is carried out in a solvent at room temperature or at a higher temperature. Suitable solvents are particularly formamide, dimethylformamide, cyclohexanone, acetone, butylacetate, pyridine; in general all solvents that do not react with isocyanate groups are suitable.

In the case of the embodiment according to which first the polymeric sulphonylchloride is formed, the polymeric sulphonylchloride can be converted into the polymeric sulphonylazide by addition at normal or slightly increased temperature of a solution of sodium azide in water and dioxan or acetone to the obtained solution of the polymeric sulphonylchloride.

The products obtained according to the invention may be precipitated for purifying purposes in methanol or other lower alcohols and dissolved again in one of the above mentioned solvents or a mixture of these solvents. It is however also possible to use directly the solution obtained after the reaction between the reaction partners. For the preparation of films that are capable of being cross-linked by light the solutions of the polymers are applied by dipping, spraying or coating to any support such as sheets of paper, metal foils in aluminium, copper, zinc, iron, titanium, molybdenum, tantalum, silver and gold, further glass or plastics.

The light-sensitivity of the applied polymers can considerably be increased by addition of sensitizers such as are known for these purposes e.g. Michler's ketone, dimethylaminobenzaldehyde, 4-H-quinolizine-4-one, compounds from the class of the naphthothiazolines, the cyanines and the triphenylmethane dyestuffs. The exposure of the layers prepared according to the invention occurs by means of light sources as commonly used in the reproduction technique such as carbon arc lamps, xenon-lamps, high-pressure mercury vapor lamps which light sources suitably radiate besides visible light also an amount of ultra-violet light which is especially effective for the photochemical cross-linking. The development of the exposed layers is generally carried out by means of organic solvents of suitable composition. These solvents may be the same as those for preparing the coating solutions of the polymers that are capable of being photochemically cross-linked. Solvents such as butyl acetate, cyclohexanone or benzene, xylene, glycol ethers and -acetates or butanone, wherein the cross-linked layer areas do not at all or only slightly swell are favoured.

The following examples illustrate the invention.

EXAMPLE 1

To a solution of 10 g. of a partly saponified copolymer of 29 parts by weight of ethylene and 71 parts by weight of vinyl acetate, which contains 0.104 mole of free hydroxyl groups, in 200 ml. of dry pyridine are added 23.3 g. of p-isocyanato-benzene sulphonylazide dissolved in 100 ml. of cyclohexanone.

The mixture is stirred for 3 hours at 60–65° C., cooled to room temperature and then poured into 500 ml. of methanol. The precipitated rubber-like polymer is washed with methanol and subsequently dissolved in 350 ml. of cyclohexanone. After addition of 0.33 g. of Michler's ketone this solution can be coated e.g. on a copper sheet which copper sheet in its turn is applied to a plastic material. The thoroughly dried light-sensitive sheet is exposed through the line negative of an electric circuit scheme and subsequently developed with butyl acetate. Then the copper areas which have become uncovered are etched away with an iron (III) chloride solution. A copper image of the circuit scheme on the plastic material as background is obtained.

Preparation of the p-isocyanato-benzene sulphonylazide 26 g. of sodiumazide are dissolved in 60 ml. of water. To this solution are dropwise added, whilst stirring at 0–5° C., 47.6 g. of p-chlorosulphonyl-benzoyl chloride dissolved in 80 ml. of acetone. The mixture is stirred for 1 hour and subsequently diluted with 200 ml. of water. The formed oil is separated and dissolved in 350 ml. of benzene. The solution is dried with calcium chloride and then heated for 4–5 hours at 80° C. The reaction is complete when gas evolution ceases. The p-isocyanato-benzene sulphonylazide obtained is precipitated with petroleum ether. The solution, however, can also be used directly after determination of the isocyanate content. Yield: 65–70%.

m-Isocyanato-benzene sulphonylazide and 2-chloro-5-azidosulphonyl phenyl isocyanate are prepared in an analogous way.

EXAMPLE 2

10 g. of an almost entirely saponified copolymer of 68 parts by weight of ethylene and 32 parts by weight of vinylacetate which contains 0.051 mole of free hydroxyl groups, are dissolved in 200 ml. of cyclohexanone at 70–80° C. Part of the solvent (20–50 ml.) is distilled off in vacuum for removing the water still present. Subsequently, 11.4 g. of m-isocyanato-benzene sulphonylazide are dissolved in 70 ml. of toluene. The mixture is stirred for 3 hours at 65° C. and cooled to room temperature.

After addition of 0.3 g. of Michler's ketone, this solution is diluted with butylacetate to 250 ml. and coated as a thin layer on a well cleaned zinc plate. The layer is air-dried for 3 min. Subsequently the light-sensitive element thus produced is exposed for 30–60 sec. through a line original with a carbon arc lamp at an exposure intensity of 1200 lux whereupon the element is developed for 1–2 min. with butyl acetate. A true negative print of the original with sharply outlined edges is obtained. By etching in 40% nitric acid an element ready for printing is produced.

EXAMPLE 3

10 g. of a saponified copolymer of 42 parts by weight of vinyl acetate and 58 parts by weight of vinylchloride, which contains 0.054 mole of free hydroxyl groups, are dissolved in 200 ml. of dry cyclohexanone at 65° C. Then 11.5 g. of p-isocyanato-benzene sulphonylchloride dissolved in 70 ml. of toluene are added. The mixture is stirred for 3 hours at 65° C. and cooled to room temperature. After addition of 4.5 g. of sodium azide dissolved in 20 ccs. of water and 50 ccs. of dioxan, the mixture is stirred for 12 hours. Subsequently benzene is added and the water is distilled over in vacuum as an azeotropic mixture. To the water-free solution is added 0.22 g. of Michler's ketone and this solution is filtered. A zinc plate coated with this layer can be exposed and developed in the same way as in Example 2. The exposed layer shows a good resistance against 90% sulphuric acid, 50% nitric acid and aqua regia.

EXAMPLE 4

10 g. of a saponified copolymer of 42 parts by weight of vinyl acetate and 58 parts by weight of vinyl chloride, which contains 0.054 mole of free hydroxyl groups, are dissolved in 200 ml. of dry cyclohexanone. Then 11.5 g. of m-isocyanato-benzene sulphonylchloride dissolved in 100 ml. of toluene are added. The mixture is stirred for 3 hours at 65° C. and cooled. After addition of 4.5 g. of sodium azide, dissolved in 20 ml. of water and 50 ml. of acetone, the mixture is stirred for 12 hours. The product obtained is precipitated in methanol and washed, whereupon it is dissolved in 240 ml. of butyl acetate. After addition of 0.22 g. of 4-dimethylamino-benzaldehyde, one proceeds as in Example 2.

EXAMPLE 5

20 g. of a hydroxyl group containing polyether, prepared from 2,2-bis(4-hydroxyphenyl)-propane and epichlorohydrin with an average molecular weight of more than 10,000 and containing 0.063 mole of free hydroxyl groups, are dissolved in 300 ccs. of cyclohexanone. 13.8 g. of p-isocyanato-benzene sulphonylchloride dissolved in 70 ccs. of cyclohexanone are added at 65° C. The mixture is stirred for 3 hours at 60–70° C. and cooled. After addition of 5.0 g. of sodium azide in 25 ml. of water and 70 ml. of dioxan, one proceeds further as in Example 4.

EXAMPLE 6

10 g. of a partly hydrolysed cellulose acetate, containing 0.068 mole of free hydroxyl groups, are dissolved in 150 ml. of water-free pyridine. At 40° C. 15.2 g. of p-isocyanato-benzene sulphonylazide, dissolved in 80 ml. of toluene are added. The mixture is stirred for 3 hours and then one proceeds further as in Example 1.

EXAMPLE 7

10 g. of a saponified copolymer of 58 parts by weight of vinylchloride and 42 parts by weight of vinylacetate, containing 0.05 mole of free hydroxyl groups, are dissolved in 200 ml. of cyclohexanone. For removing the water residue, part of the solvent (30–50 ml.) is distilled off in vacuum. At 65° C. 12.8 g. of 2-chloro-5-azidosulphonyl-phenyl isocyanate in 70 ccs. benzene are added. The mixture is stirred for 3 hours and subsequently one proceeds as in Example 2.

What we claim is:

1. Light-sensitive photographic recording material comprising a support and a light-sensitive layer wherein said layer comprises a polymer that contains and aromatic azidosulphonyl group linked to the polymer chain by means of an urethane radical and which polymer can be photochemically cross-linked.

2. A light-sensitive photographic recording material comprising a support and a light-sensitive layer wherein said layer comprises a polymer in which a plurality of active hydrogen-containing groups have been replaced by a urethane radical linked to an aromatic azidosulphonyl group, the said polymer being capable of being photochemically cross-linked.

3. The light-sensitive photographic recording material of claim 2 wherein the active hydrogen-containing groups are hydroxyl groups.

4. A light-sensitive photographic recording material according to claim 1 wherein said polymer comprises recurring units corresponding to the following general formula:

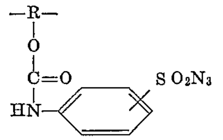

wherein R represents any recurring unit of the polymer chain and wherein the phenyl ring is optionally substituted by a radical selected from the group consisting of a halogen atom, an alkyl group of at most five carbon atoms, an alkoxy group of at most five carbon atoms, and a nitro group.

5. A light-sensitive photographic recording material according to claim 4 wherein the said polymer contains monomer units derived from the polymerization of vinyl alcohol.

6. A light-sensitive photographic recording material according to claim 5 wherein said vinyl alcohol polymer is a copolymer of vinyl alcohol and a monomer selected from the group consisting of ethylene, vinyl chloride, a vinyl ester, and a vinyl ether.

7. A light-sensitive photographic recording material according to claim 2 wherein said polymer is selected from the group consisting of hydroxyl group-containing polyesters, polyethers, polyurethanes, and polyamides.

8. A light-sensitive photographic recording material according to claim 2 wherein said polymer is selected from the group consisting of cellulose, starch, gelatin and hydroxyl group-containing derivatives of cellulose, starch, and gelatin.

9. A light-sensitive photographic recording material according to claim 2 wherein said material contains a sensitizer to enhance the light-sensitivity of the polymeric compound.

10. A light-sensitive photographic recording material according to claim 9 wherein said sensitizer is a member selected from the group consisting of Michler's ketone, dimethylaminobenzaldehyde, 4-H-quinolizine-4-one, a naphthothiazoline, a cyanine, and a triphenyl methane dye.

11. Process for producing a photographic resist image by the photochemical insolubilization of a polymeric material wherein a photographic material according to claim 2 is exposed to actinic light through a line original whereby in the exposed areas said polymeric material is cross-linked to the insoluble state, and removing the soluble polymeric material in the unexposed areas, thereby forming a photographic resist image.

12. Process for producing a photographic printing plate by the photochemical insolubilization of a polymeric material wherein a photographic material according to claim 2 is exposed to actinic light through a line original whereby in the exposed areas said polymeric material is cross-linked to the insoluble state, and removing the soluble polymeric material in the unexposed areas, thereby forming a photographic printing plate.

13. A recording process wherein a recording material according to claim 2 is exposed to a pattern of actinic light representing matter to be recorded so that over the area of said material selective or differential insolubilization takes place.

References Cited

UNITED STATES PATENTS

| | | | |
|---|---|---|---|
| 2,728,745 | 12/1955 | Smith et al. | 96—115 XR |
| 2,948,610 | 8/1960 | Merrill et al. | 96—33 |
| 3,058,944 | 10/1962 | Breslow et al. | 260—41 |
| 3,143,423 | 8/1964 | Reynolds et al. | 96—91 |
| 3,203,936 | 8/1965 | Breslow et al. | 260—79.3 |
| 3,261,785 | 7/1966 | Robinson | 260—2.5 |
| 3,278,305 | 10/1966 | Laridon et al. | 96—91 XR |
| 3,301,841 | 1/1963 | Burleigh et al. | 260—94.4 |

NORMAN G. TORCHIN, Primary Examiner

RONALD H. SMITH, Assistant Examiner

U.S. Cl. X.R.

96—115; 260—47, 79.3, 349